(12) United States Patent
Nian et al.

(10) Patent No.: US 11,009,743 B2
(45) Date of Patent: May 18, 2021

(54) DISPLAY PANEL

(71) Applicant: AU Optronics Corporation, Hsin-Chu (TW)

(72) Inventors: Han-Sheng Nian, Hsin-Chu (TW);
Li-Kai Chia, Hsin-Chu (TW);
Yu-Cheng Shih, Hsin-Chu (TW);
Wei-Syun Wang, Hsin-Chu (TW);
Shan-Ying Chou, Hsin-Chu (TW);
Sheng-Ming Huang, Hsin-Chu (TW);
Jen-Kuei Lu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/716,769

(22) Filed: Dec. 17, 2019

(65) Prior Publication Data
US 2020/0326588 A1    Oct. 15, 2020

(30) Foreign Application Priority Data

Apr. 10, 2019    (TW) .................................. 108112549

(51) Int. Cl.
| | |
|---|---|
| *G02F 1/1335* | (2006.01) |
| *H01L 27/32* | (2006.01) |
| *H01L 51/52* | (2006.01) |

(52) U.S. Cl.
CPC .. *G02F 1/133528* (2013.01); *G02F 1/133512* (2013.01); *G02F 1/133553* (2013.01); *H01L 27/3244* (2013.01); *H01L 51/5284* (2013.01); *G02F 1/133541* (2021.01); *G02F 1/133548* (2021.01); *G02F 2203/02* (2013.01)

(58) Field of Classification Search
None
See application file for complete search history.

(56) References Cited

U.S. PATENT DOCUMENTS

2013/0242212 A1*  9/2013  Huang .............. G02F 1/133555
                                          349/15
2015/0331279 A1*  11/2015 Kimura ................. G02B 5/201
                                          349/42

(Continued)

FOREIGN PATENT DOCUMENTS

| CN | 106526952 A | 3/2017 |
|---|---|---|
| EP | 3370112 A1 | 9/2018 |

*Primary Examiner* — Ryan Crockett
(74) *Attorney, Agent, or Firm* — McClure, Qualey & Rodack, LLP

(57) ABSTRACT

A display panel has a display area and a peripheral area. The peripheral area is located outside the display area. The display panel includes a first substrate, a second substrate, and a display medium layer. The second substrate is located above the first substrate and includes a first polarization layer, a first quarter wave plate (QWP), a reflection layer, and a pixel array. The first polarization layer is located within the display area and the peripheral area and includes a wire-grid polarizer. The first QWP is located within the peripheral area. The reflection layer is located within the peripheral area, in which the first QWP is located between the first polarization layer and the reflection layer. The pixel array is at least located within the display area. The display medium layer is located between the first substrate and the second substrate.

9 Claims, 8 Drawing Sheets

(56) References Cited

U.S. PATENT DOCUMENTS

| | | | |
|---|---|---|---|
| 2015/0346549 A1* | 12/2015 | Fang | G02F 1/1368 |
| | | | 359/247 |
| 2016/0026039 A1* | 1/2016 | Sakai | G02F 1/133555 |
| | | | 345/1.3 |
| 2016/0161798 A1* | 6/2016 | Lee | G02F 1/133528 |
| | | | 349/65 |
| 2016/0187709 A1* | 6/2016 | Lee | G02F 1/133308 |
| | | | 349/58 |
| 2017/0168338 A1* | 6/2017 | Bae | G02F 1/13363 |

* cited by examiner

DISPLAY PANEL

RELATED APPLICATIONS

This application claims priority to Taiwan Application Serial Number 108112549, filed Apr. 10, 2019, which is herein incorporated by reference.

BACKGROUND

Field of Invention

The present disclosure relates to a display panel.

Description of Related Art

In various consumer electronic products, display panels have been widely utilized to provide images or operation menus. In this regard, with the development of science and technology, display panels have also developed into a variety of forms. For example, not only can mirror display panels provide images or operation menus, but they can also provide the mirror function to satisfy the demand of the consumers.

For a mirror display panel, one piece of traditional semi lens glass is required on the display panel, and the display area and the peripheral area of the display panel are able to provide specular reflection functions. However, owing to the different structures of the display area and the peripheral area of the display panel, the specular reflection effects provided by them are different, which in turn causes the user experience of the customers to be affected. That is to say, in the development of the mirror display panel, how to lighten the weight and uniform the specular reflection effect has become one of the important subjects in related fields.

SUMMARY

A display panel is provided. The display panel has a display area and a peripheral area. The peripheral area is located outside the display area. The display panel comprises a first substrate, a second substrate, and a display medium layer. The second substrate is located above the first substrate and comprises a first polarization layer, a first quarter wave plate, a reflection layer, and a pixel array. The first polarization layer is located within the display area and the peripheral area and comprises a wire-grid polarizer. The first quarter wave plate is located within the peripheral area. The reflection layer is located within the peripheral area. The first quarter wave plate is located between the first polarization layer and the reflection layer. The pixel array is at least located within the display area. The display medium layer is located between the first substrate and the second substrate.

In the foregoing, the first quarter wave plate is further located within the display area, and the second substrate further comprises a second quarter wave plate. The second quarter wave plate is located within the display area, and the second quarter wave plate and the first quarter wave plate are together located between the pixel array and the first polarization layer. The display panel further comprises a second polarization layer, and the first quarter wave plate, the second quarter wave plate, and the display medium layer are together located between the second polarization layer and the first polarization layer.

In the foregoing, an optical axis of the first quarter wave plate is positive 45 degrees relative to an optical axis of the second polarization layer, and an optical axis of the second quarter wave plate is negative 45 degrees relative to the optical axis of the second polarization layer.

In the foregoing, the second substrate further comprises a light absorption layer. The light absorption layer is located between the first polarization layer and the pixel array, and located between the first polarization layer and the first quarter wave plate.

In the foregoing, a material of the reflection layer comprises aluminum, gold, silver, titanium, molybdenum oxide, tantalum, or a combination thereof.

In the foregoing, the first substrate comprises a plurality of color resist layers, and a vertical projection range of the first substrate on the second substrate falls within a boundary of the first polarization layer.

In the foregoing, each of the first quarter wave plate and the reflection layer is in a loop and surrounds the display area.

In the foregoing, the second substrate further comprises a drive circuit layer. The drive circuit layer is located within the peripheral area and electrically connected to the pixel array, and the reflection layer is located between the drive circuit layer and the first polarization layer.

The present disclosure provides a display panel. The display panel has a display area and a peripheral area. The peripheral area is located outside the display area. The display panel comprises a first substrate and a second substrate. The first substrate comprises a light emitting diode array, and the light emitting diode array is located within the display area. The second substrate is located above the first substrate and comprises a first polarization layer, a first quarter wave plate, and a light absorption layer. The first polarization layer is located within the display area and the peripheral area, and comprises a wire-grid polarizer. The first quarter wave plate is located within the display area and the peripheral area. The light absorption layer is located within the display area and the peripheral area, and the light absorption layer and the first quarter wave plate are together located between the first substrate and the first polarization layer, and the light absorption layer is located between the first quarter wave plate and the first polarization layer.

In the foregoing, the first substrate further comprises a circuit layer. The circuit layer is at least located within the peripheral area and electrically connected to the light emitting diode array, and the light absorption layer and the first quarter wave plate are together located between the circuit layer and the first polarization layer.

With the above configuration, the display panel can be switched between the image mode and the specular reflection mode. When the display panel is in the image mode, the display medium layer can be controlled through the pixel array so that the display panel provides the image. When the display panel is in the specular reflection mode, the light beams leaving from the interior of the display panel can be attenuated by the layers in the second substrate to uniform the specular reflection effect provided by the display panel.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and elements are schematically depicted in order to simplify the drawings.

It will be understood that, although the terms first, second, third etc. may be used herein to describe various elements, components, areas, regions, layers and/or sections, these elements, components, areas, regions, layers and/or sections should not be limited by these terms. These terms are only used to distinguish one element, component, area, region, layer or section from another element, component, area, region, layer or section. Thus, a first element, component, area, region, layer or section discussed below could be termed a second element, component, area, region, layer or section without departing from the teachings of the present disclosure. As used herein, "about," "approximately," or "substantially" includes the value and average values within acceptable deviations of the particular value determined by one of ordinary skill in the art. For example, "about," "approximately," or "substantially" can mean within one or more standard deviations of the value, or within ±30%, ±20%, ±15%, ±10%, ±5% of the value.

Figure 1A:
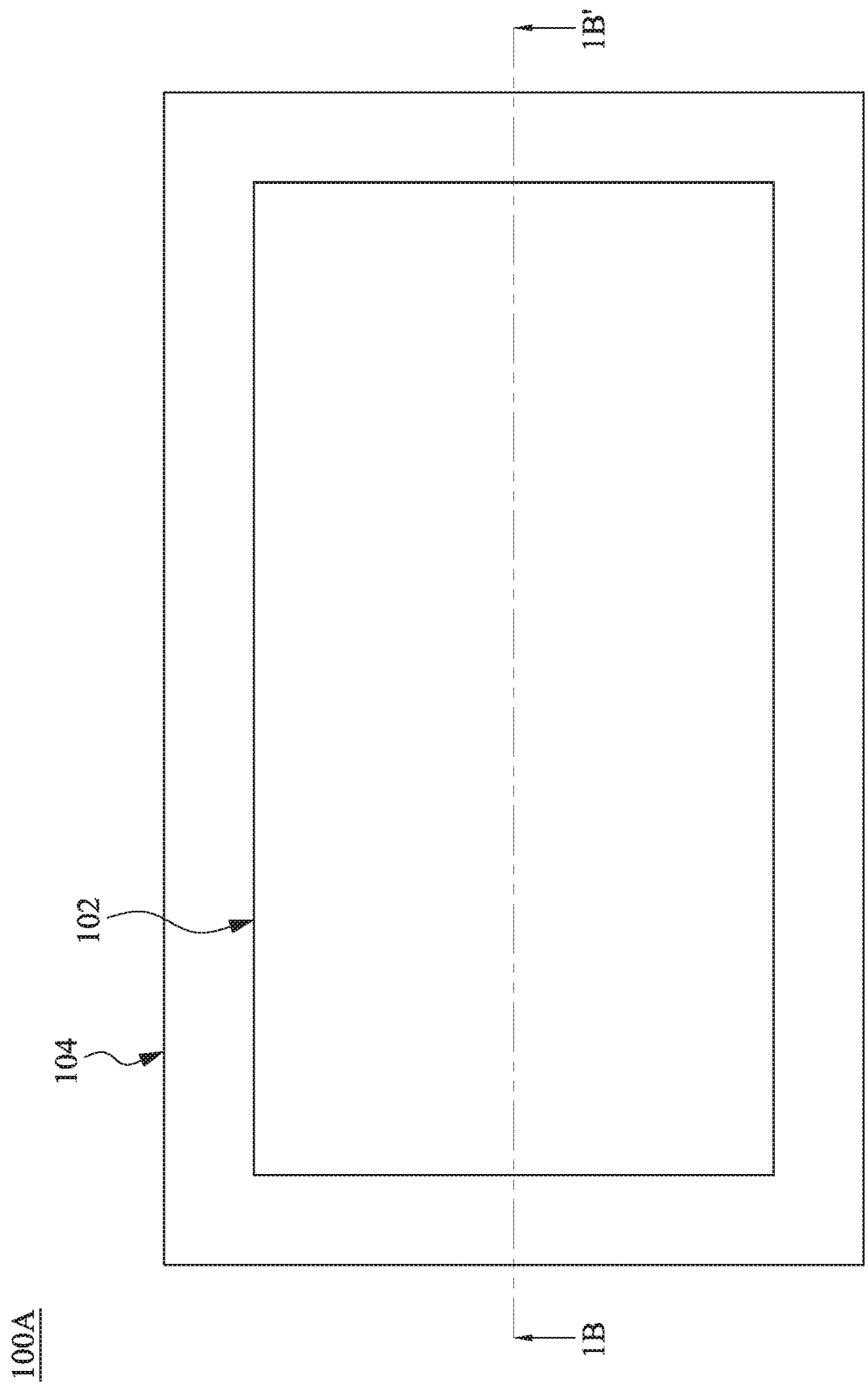
FIG. 1A is a top schematic diagram of a display panel according to a first embodiment of the present disclosure.
Figure 1B:
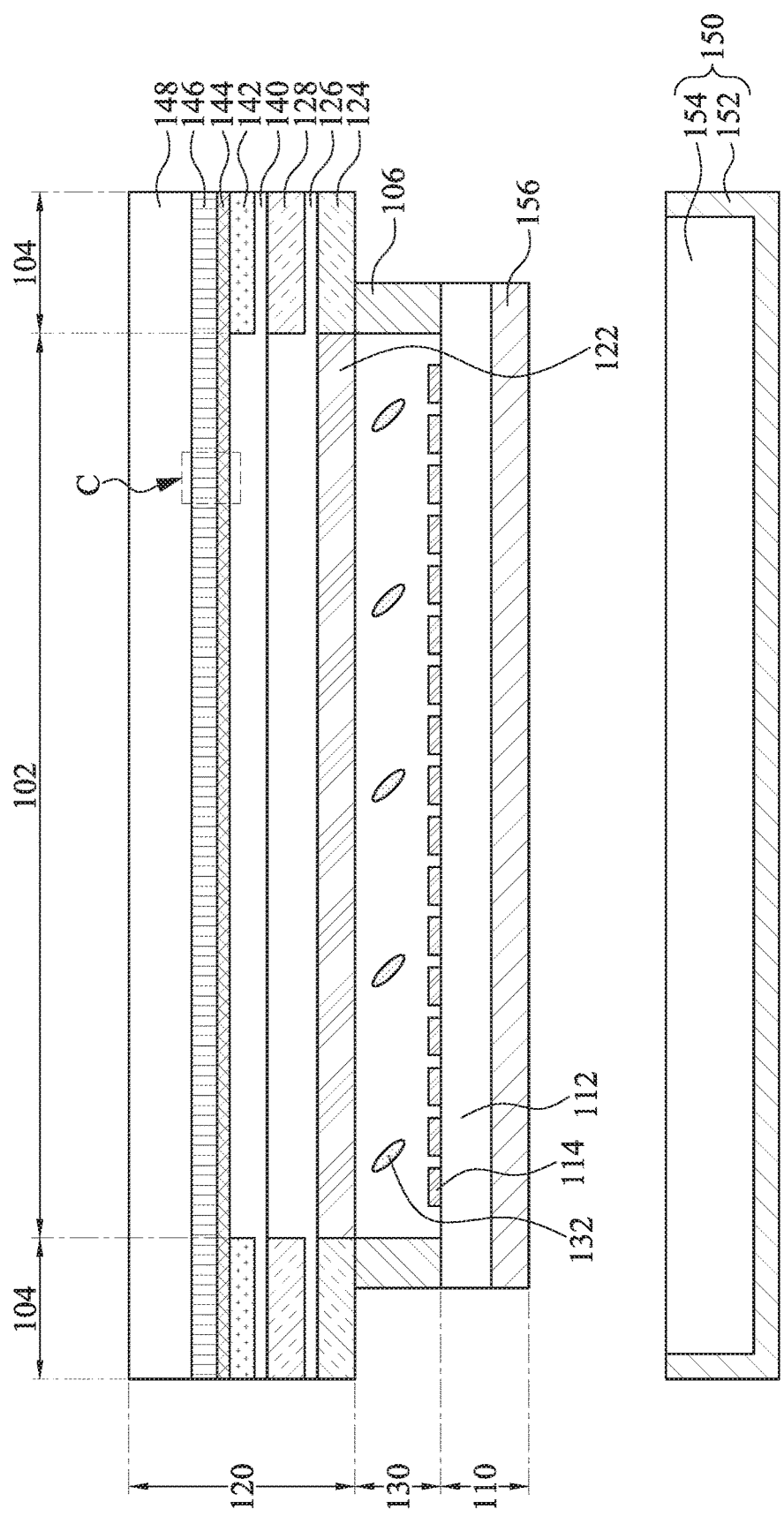
FIG. 1B is a schematic cross-sectional view taken along line 1B-1B' in FIG. 1A.

A description is provided with reference to FIG. 1A and FIG. 1B. FIG. 1A is a top schematic diagram of a display panel 100A according to a first embodiment of the present disclosure. FIG. 1B is a schematic cross-sectional view taken along line 1B-1B' in FIG. 1A. As shown in FIG. 1A, the display panel 100A has a display area 102 and a peripheral area 104, and the peripheral area 104 is located outside the display area 102. The display panel 100A can provide an image through the display area 102. The peripheral area 104 may be regarded as a bezel of the display panel 100A, which may be, for example, an area where wirings are placed. As shown in FIG. 1B, the display panel 100A comprises a first substrate 110, a second substrate 120, and a display medium layer 130. The second substrate 120 is located above the first substrate 110, and the display medium layer 130 is located between the first substrate 110 and the second substrate 120.

The first substrate 110 may be a color filter substrate. In greater detail, the first substrate 110 may comprise a first transparent substrate 112 and color resist layers 114, and the color resist layers 114 are disposed on the first transparent substrate 112. In some embodiments, the first transparent substrate 112 may be a glass substrate. In some embodiments, each of the color resist layers 114 may be a red color resist layer, a green color resist layer, or a blue color resist layer.

The display panel 100A may further comprise a spacer 106. The spacer is located between the first substrate 110 and the second substrate 120. In greater detail, the spacer 106 may be disposed on the first substrate 110 and support the second substrate 120 so that the first substrate 110 can be spaced apart from the second substrate 120 by a distance. The display medium layer 130 fills between the first substrate 110 and the second substrate 120, and may have a display medium 132. The display medium 132 is, for example, liquid crystal molecules.

The second substrate 120 may be an integration of a polarizing structure and a pixel array. In greater detail, the second substrate 120 may comprise a pixel array 122, a drive circuit layer 124, a first isolation layer 126, a reflection layer 128, a second isolation layer 140, a first quarter wave plate 142, a light absorption layer 144, a first polarization layer 146, and a second transparent substrate 148.

The pixel array 122 is at least located within the display area 102. The pixel array 122 may comprise thin film transistors and pixel electrodes (not shown in the figure). The thin film transistors are electrically connected to the pixel electrodes to apply a voltage to the pixel electrodes through the thin film transistors so that an electric field is coupled. The electric field coupled by the pixel array 122 can control the display medium 132 of the display medium layer 130 to rotate the display medium 132. The drive circuit layer 124 is located within the peripheral area 104, and the drive circuit layer 124 can be electrically connected to the pixel array 122. In some embodiments, the drive circuit layer 124 may comprise a gate on array (GOA), outer lead boning (OLB) contacts, a fan-out package, electrode pads, wirings, or a combination thereof. In some embodiments, the pixel array 122 may be electrically connected to an external circuit or a connection terminal through the drive circuit layer 124.

The first isolation layer 126 is disposed on the pixel array 122 and the drive circuit layer 124. In some embodiments, a material of the first isolation layer 126 may be an organic material or an inorganic material, such as an epoxy resin, silicon oxide (SiOx), silicon nitride (SiNx), a composite layer composed of silicon oxide and silicon nitride, or other suitable dielectric material.

The reflection layer 128 is disposed on the first isolation layer 126, and is located within the peripheral area 104. The reflection layer 128 can be separated from the pixel array 122 and the drive circuit layer 124 through the first isolation layer 126. The reflection layer 128 may be in a loop. In greater detail, the reflection layer 128 is in the loop at a view angle perpendicular to the display panel 100A (for example, the view angle in FIG. 1A) and surrounds the display area 102. In other words, an inner boundary of the looped reflection layer 128 may be aligned with a boundary between the display area 102 and the peripheral area 104. In addition, in the embodiment shown in FIG. 1B, the looped reflection layer 128 may surround part of the first isolation layer 126. In some embodiments, a material of the reflection layer 128 may comprise aluminum, gold, silver, titanium, molybdenum oxide, tantalum, or a combination thereof. Under the circumstances that the material of the reflection layer 128 comprises molybdenum oxide, tantalum, or the combination thereof, the reflection layer 128 also has light-absorbing property in addition to light-reflecting property. For example, the combination of molybdenum oxide and tantalum can form a blackened material and have the light-absorbing property, thus resulting in a light reflectance that can be provided approximately greater than 0% and less than 10%. In some embodiments, a thickness of the reflection layer 128 may be between 50 nanometers (nm) and 300 nanometers.

The second isolation layer 140 is disposed on the first isolation layer 126 and the reflection layer 128. In some embodiments, a material of the second isolation layer 140 may be an organic material or an inorganic material, such as an epoxy resin, silicon oxide (SiOx), silicon nitride (SiNx), a composite layer composed of silicon oxide and silicon nitride, or other suitable dielectric material.

The first quarter wave plate 142 is disposed on the second isolation layer 140, and is located within the peripheral area 104. The first quarter wave plate 142 may also be in a loop. That is, the first quarter wave plate 142 is in the loop at the view angle perpendicular to the display panel 100A (for example, the view angle in FIG. 1A) and surrounds the display area 102. Similarly, in the configuration shown in FIG. 1B, the looped first quarter wave plate 142 may surround part of the second isolation layer 140. In some embodiments, the first quarter wave plate 142 may comprise a liquid crystal film, a grating structure, a nanostructure, or a combination thereof. In some embodiments, a thickness of the grating structure or the nanostructure of the first quarter wave plate 142 may be between 600 nanometers and 1500 nanometers. Although in FIG. 1B the first quarter wave plate 142 is depicted to be separated from the reflection layer 128 through the second isolation layer 140, the present disclosure is not limited in this regard. In other embodiments, the reflection layer 128 and the first quarter wave plate 142 may be configured in a stack and in contact with each other.

Figure 1C:
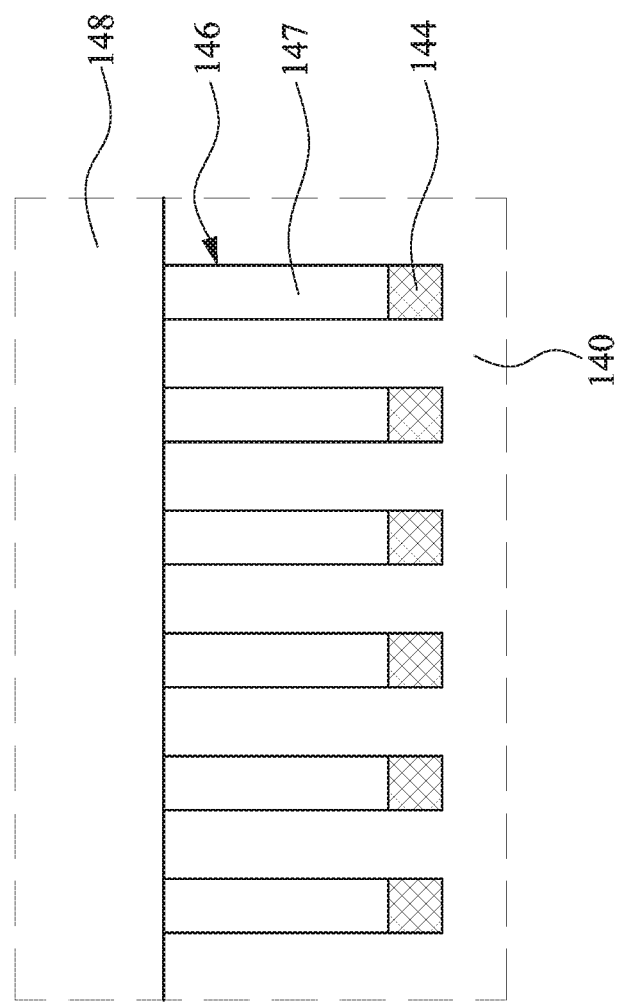
FIG. 1C is an enlarged schematic diagram of a region C in FIG. 1B.

A description is provided with reference to FIG. 1B and FIG. 1C. FIG. 1C is an enlarged schematic diagram of a region C in FIG. 1B. The light absorption layer 144 and the first polarization layer 146 are disposed on the second isolation layer 140 and the first quarter wave plate 142, and are located within the display area 102 and the peripheral area 104. In the peripheral area 104, the drive circuit layer 124, the reflection layer 128, the first quarter wave plate 142, the light absorption layer 144, and the first polarization layer 146 may be stacked in sequence. In greater detail, the first quarter wave plate 142 and the light absorption layer 144 together may be located between the first polarization layer 146 and the reflection layer 128, and the reflection layer 128 is located between the drive circuit layer 124 and the first polarization layer 146.

The first polarization layer 146 comprises a wire-grid polarizer (WGP). In greater detail, the wire-grid polarizer of the first polarization layer 146 may be formed by a plurality of parallel metal wires 147. The wire-grid polarizer of the first polarization layer 146 can allow a light beam in a single polarization state (such as P polarization) to pass through and a light beam of another polarization state (such as S polarization) to be reflected. In some embodiments, a thickness of the first polarization layer 146 may be between 100 nanometers and 500 nanometers.

The light absorption layer 144 may be located between the pixel array 122 and the first polarization layer 146, and is also located between the first quarter wave plate 142 and the first polarization layer 146. In greater detail, the metal wires 147 of the first polarization layer 146 may have lower surfaces, and the lower surfaces face the first quarter wave plate 142 or the second isolation layer 140. The light absorption layer 144 may be disposed on the lower surfaces of the metal wires 147 of the first polarization layer 146. A material of the light absorption layer 144 can allow a light absorption rate of the light absorption layer 144 to be greater than 90%. In some embodiments, the material of the light absorption layer 144 may comprise molybdenum oxide, tantalum, or a combination thereof. As mentioned previously, the combination of molybdenum oxide and tantalum can form the blackened material. In some embodiments, a thickness of the light absorption layer 144 may be between 50 nanometers and 150 nanometers.

The second transparent substrate 148 is disposed on the pixel array 122, the drive circuit layer 124, the first isolation layer 126, the reflection layer 128, the second isolation layer 140, the first quarter wave plate 142, the light absorption layer 144, and the first polarization layer 146. The second transparent substrate 148 may be a glass substrate, which can be used as a carrier substrate of the second substrate 120 during a process. For example, a formation method of the first polarization layer 146 may comprise forming a metal layer on the second transparent substrate 148, and then patterning the metal layer into the plurality of parallel metal wires 147.

That is to say, layers from the first polarization layer 146 to the pixel array 122 are sequentially formed on the second transparent substrate 148, so that the reflection layer 128, the first quarter wave plate 142, and the first polarization layer 146 may be regarded as an embedded structure of the display panel 100A. As a result, the integration of the polarizing structure and the pixel array is achieved. In addition, under the circumstances that layers above the pixel array 122 use metallic materials, these layers can be compatible with a process temperature of the pixel array 122. For example, under the circumstances that the reflection layer 128 is formed by using a metallic material and the first quarter wave plate 142 is formed by adopting an inorganic nano-grating structure, the reflection layer 128 and the first quarter wave plate 142 are prevented from being affected by the process temperature of pixel array 122. In addition to that, such a configuration can allow the second substrate 120 to be fabricated by using a single carrier substrate, so that the lightweight display panel 100A can be achieved.

Additionally, the display panel 100A further comprises a backlight module 150 and a second polarization layer 156. The backlight module 150 is disposed on a same side as the first substrate 110 and the display medium layer 130, and the first substrate 100 is located between the backlight module 150 and the display medium layer 130. The backlight module 150 comprises a frame 152 and a light source 154. The light source 154 is disposed in the frame 152. The light source 154 may comprise light emitting elements and a light guide plate (not shown in the figure), and is configured to provide illumination to the first substrate 110. The second polarization layer 156 may be adhered to the first transparent substrate 112 of the first substrate 110, so that the first transparent substrate 112 is located between the second polarization layer 156 and the color resist layers 114. In some embodiments, a structure of the second polarization layer 156 is different from the first polarization layer 146. For example, the second polarization layer 156 may be an absorbing polarizer, that is, the second polarization layer 156 can allow a light beam in a single polarization state (such as P polarization) to pass through and absorb a light beam in another polarization state (such as S polarization). In some embodiments, an optical axis of the first polarization layer 146 is orthogonal to an optical axis of the second polarization layer 156, and an optical axis of the first quarter wave plate 142 has a phase difference of 45 degrees relative to an optical axis of the second polarization layer 156.

Through the above configuration, the display panel 100A can provide a full specular reflection effect. Here, "full" comprises the display area 102 and the peripheral area 104. In greater detail, the display panel 100A can be switched between an image mode and a specular reflection mode.

When the display panel 100A is in the image mode, pixel electrodes can be driven correspondingly through the pixel array 122 for a pixel area to provide an image so as to couple the electric field. The display medium 132 of the display medium layer 130 is thus controlled. The display medium 132 in the display medium layer 130 affected by the electric field can maintain a polarization state of light beams that pass through unchanged. Then, when the backlight module 150 provides light beams towards the first substrate 110, the second polarization layer 156 can allow P-polarized light to pass through. After the P-polarized light passes through the display medium layer 130, a polarization state of the P-polarized light can be maintained. After that, when the P-polarized light reaches the first polarization layer 146, the P-polarized light can pass through the first polarization layer 146 due to the P polarization state. As a result, the corresponding pixel area of the display panel 100A can provide the image.

When the display panel 100A is in the image mode, for a pixel area to provide a black effect, a polarization state of light beams that pass through can be changed through an optical activity of the display medium layer 130. Therefore, after the second polarization layer 156 allows the P-polarized light to pass through, a polarization state of light beams passing through the display medium layer 130 from the second polarization layer 156 is S polarization, that is S-polarized light is generated. Then, when the S-polarized light reaches the first polarization layer 146, the S-polarized light can be reflected from the first polarization layer 146 due to the S polarization state. In other words, light beams propagate from the first substrate 110 towards the second substrate 120 do not leave the display area 102 of the display panel 100A, so that the corresponding pixel area of the display panel 100A can provide the black effect.

When the display area 102 of the display panel 100A is so switched that a whole pixel area provides the black effect, the display panel 100A can be switched to the specular reflection mode. However, the present disclosure is not limited in this regard. In other embodiments, the display panel 100A can also be switched between the image mode and the specular reflection mode by switching whether to provide the illumination of the backlight module 150 or not.

When the display panel 100A is in the specular reflection mode, for light beams above the display panel 100A propagating towards the display panel 100A, S-polarized light in the light beams will be reflected from the first polarization layer 146 so that the display panel 100A can provide the specular reflection effect through the reflected S-polarized light. In addition, P-polarized light in the light beams will pass through the first polarization layer 146 and enter the display panel 100A. In this regard, light intensity of the P-polarized light when leaving the display panel 100A can be reduced through the layer configuration in the display panel 100A, thus uniforming the specular reflection effects of the display area 102 and the peripheral area 104.

Figure 1D:
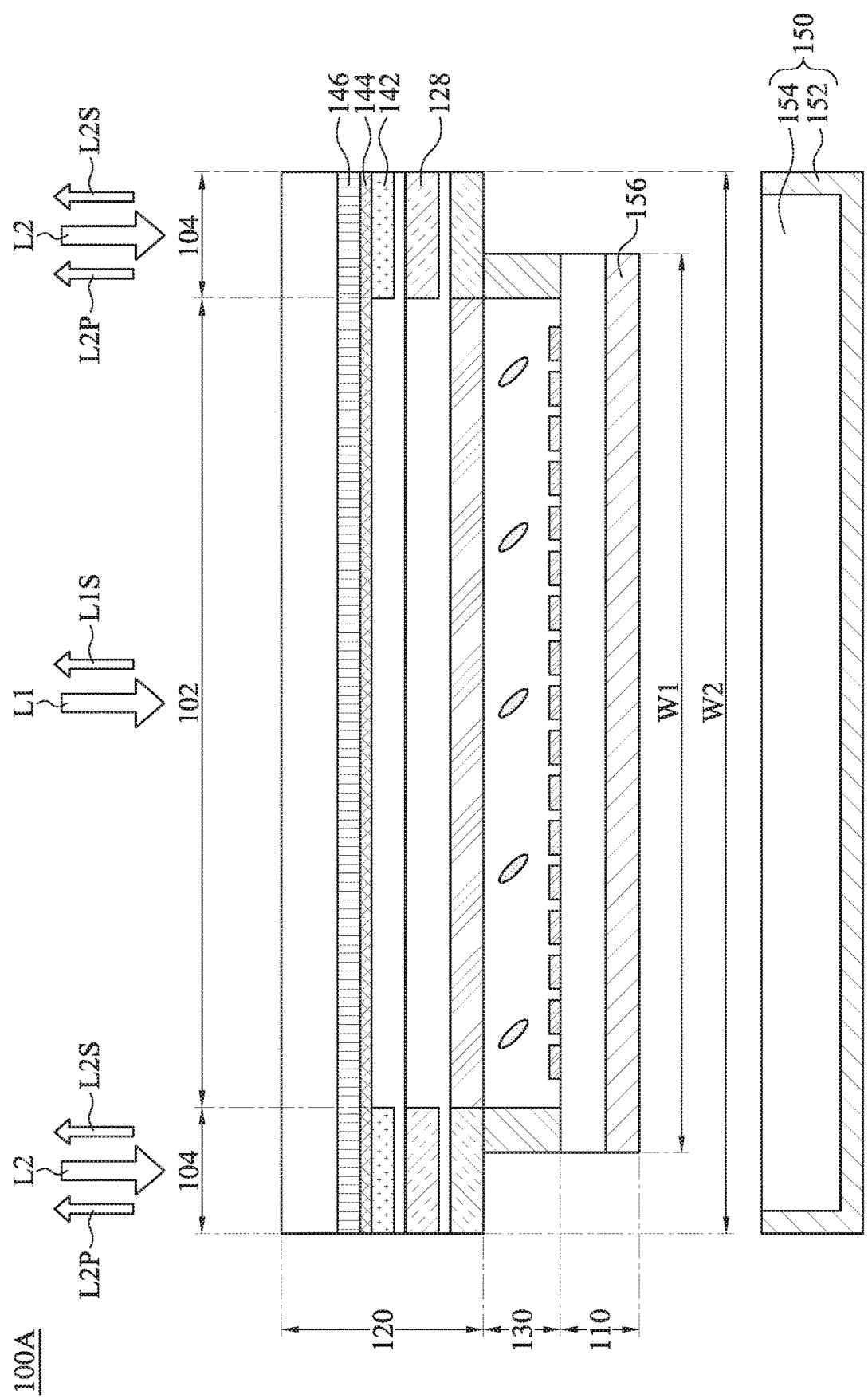
FIG. 1D is a schematic cross-sectional view of the display panel of FIG. 1B when the display panel is in a specular reflection mode.

A description is provided with reference to FIG. 1D. FIG. 1D is a schematic cross-sectional view of the display panel 100A of FIG. 1B when the display panel 100A is in the specular reflection mode. Optical paths of the light beams above the display panel 100A propagating towards the display panel 100A are further described as follows. To simplify matters, a light beam above the display panel 100A propagating towards the display area 102 of the display panel 100A is represented by a light beam L1, and light beams above the display panel 100A propagating towards the peripheral area 104 of the display panel 100A are represented by light beams L2.

When the light beam L1 reaches the first polarization layer 146, S-polarized light in the light beam L1 is reflected from the first polarization layer 146 (this S-polarized light is represented by a light beam L1S). In addition to that, P-polarized light in the light beam L1 can pass through the first polarization layer 146, and the P-polarized light will be converted into S-polarized light after passing through the display medium layer 130. After that, the S-polarized light converted by the display medium layer 130 is absorbed by the second polarization layer 156.

When the light beam L2 reaches the first polarization layer 146, S-polarized light in the light beam L2 is reflected from the first polarization layer 146 (this S-polarized light is represented by a light beam L2S). In addition to that, P-polarized light in the light beam L2 can pass through the first polarization layer 146, and propagates towards the first quarter wave plate 142. The P-polarized light will be converted into circularly polarized light after passing through the first quarter wave plate 142, and the circularly polarized light is then reflected from the reflection layer 128. In this regard, after the circularly polarized light is reflected from the reflection layer 128, its polarization direction is reversed, so that the circularly polarized light reflected from the reflection layer 128 is converted into S-polarized light after passing through the first quarter wave plate 142 and propagates towards the first polarization layer 146. After that, this S-polarized light is reflected from the first polarization layer 146, and reaches the first quarter wave plate 142 again. In the optical path where the S-polarized light propagates from the first quarter wave plate 142 to the first polarization layer 146 and is then reflected back to the first quarter wave plate 142, the light intensity of the S-polarized light is attenuated because of the absorption of the light absorption layer 144.

Even if the S-polarized light is converted into P-polarized light in the subsequent optical path and passes through the first polarization layer 146 (this P-polarized light is represented by light beams L2P), the light intensity of the light beam L2P is much less than the light intensity of the light beam L1S or L2S after the attenuation by the light absorption layer 144. As a result, the light intensity of the light beam L1S approaches a sum of the light intensities of the light beams L2P and L2S.

Therefore, the reflectance of the display area approaches the reflectance of the peripheral area in the display panel through the above configuration. The difference between the illumination intensities provided by the display area and the peripheral area can thus be reduced when the display panel is in the specular reflection mode. In this regard, since the specular reflection effect provided by the display panel correlates with the illumination intensities that are provided, the above configuration can be used to uniform the specular reflection effects provided by the display area and the peripheral area so as to reduce the identifiability of the boundary between the display area and the peripheral area. As a result, a user's viewing experience of the specular reflection effect is improved.

Additionally, since the peripheral area 104 of the display panel 100A does not need to provide any image, the first substrate 110 that serves as the color filter substrate is not required to be extended to the peripheral area 104 of the display panel 100A. Hence, a size of the first substrate 110 is smaller than a size of the second substrate. Here, the size includes "length" and "width". For example, a width W1 of the first substrate 110 is smaller than a width W2 of the second substrate 120, as shown in FIG. 1B. In greater detail, a vertical projection range of the first substrate 110 on the second substrate 120 falls within a boundary of the first polarization layer 146. Through this configuration, a space underneath the second substrate 120 in the peripheral area 104 of the display panel 100A can be used for accommodating some other elements. For example, the bezel (not shown in the figure) of the display panel 100A can be extended thereto. Alternatively, the space can be used for accommodating other circuit configurations.

In addition to that, the material of the reflection layer 128 may be adjusted depending on reflection requirements or process conditions. In some embodiments, the reflection layer 128 may be formed by using a blackened material to enhance the previously mentioned uniforming effect. In other embodiments, the reflection layer 128 may be formed by using a metallic material, such as aluminum, so as to meet the process conditions.

Figure 2A:
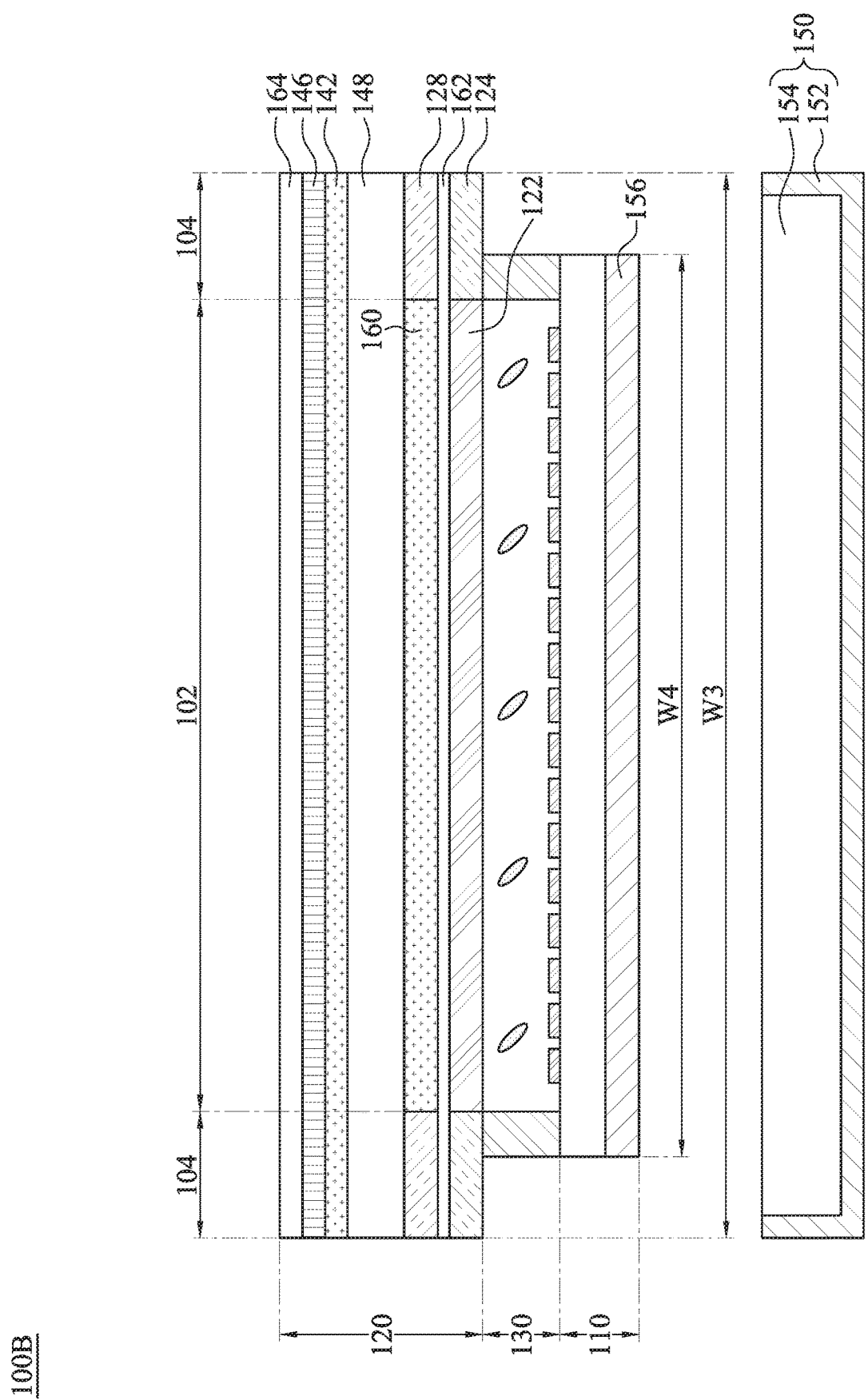
FIG. 2A is a schematic cross-sectional view of a display panel according to a second embodiment of the present disclosure.

A description is provided with reference to FIG. 2A. FIG. 2A is a schematic cross-sectional view of a display panel 100B according to a second embodiment of the present disclosure. At least one difference between the present embodiment and the first embodiment is that a structure of the second substrate 120 according to the present embodiment is different from a structure of the second substrate 120 according to the first embodiment, and the second substrate 120 according to the present embodiment further comprises a second quarter wave plate 160.

Since the configuration of the pixel array 122 and the drive circuit layer 124 of the second substrate 120 according to the present embodiment is similar to that of the first embodiment, a description in this regard is not provided. A third isolation layer 162 covers the pixel array 122 and the drive circuit layer 124. A material of the third isolation layer 162 may be the same as the material of the first isolation layer 126.

The reflection layer 128 and the second quarter wave plate 160 are disposed on the third isolation layer 162. The reflection layer 128 is located within the peripheral area 104, and the second quarter wave plate 160 is located within the display area 102. Similarly, the reflection layer 128 is in a loop, and the looped reflection layer 128 may surround the second quarter wave plate 160. In the embodiment shown in FIG. 2A, a material of the reflection layer 128 may comprise molybdenum oxide, tantalum, or a combination thereof, and the second quarter wave plate 160 may comprise a liquid crystal film, a grating structure, a nanostructure, or a combination thereof.

The second transparent substrate 148 is disposed on the pixel array 122, the drive circuit layer 124, the third isolation layer 162, the reflection layer 128, and the second quarter wave plate 160, and layers from the reflection layer 128 and the second quarter wave plate 160 to the pixel array 122 may be sequentially formed on the second transparent substrate 148. The reflection layer 128 and the second quarter wave plate 160 can thus be regarded as an embedded structure of the display panel 100B.

In the present embodiment, positions of the first quarter wave plate 142 and the first polarization layer 146 are changed to be above the second transparent substrate 148. That is, the first quarter wave plate 142 and the first polarization layer 146 and the pixel array 122 are located on opposite sides of the second transparent substrate 148. The first quarter wave plate 142 is located between the second transparent substrate 148 and the first polarization layer 146. Additionally, the first quarter wave plate 142 may further be located within the display area 102, that is, both the first quarter wave plate 142 and the first polarization layer 146 are located within the display area 102 and the peripheral area 104.

The second transparent substrate 148 can also be used as a carrier substrate when forming the first quarter wave plate 142 and the first polarization layer 146. In other words, the first quarter wave plate 142 and the first polarization layer 146 are sequentially formed on the second transparent substrate 148. Therefore, each layer of the second substrate 120 can be completed under the circumstances that a single transparent substrate is used, thus reducing the number of transparent substrates used to achieve the lightweight display panel 100B. In addition, the second substrate 120 may further comprise a fourth isolation layer 164 disposed on the first polarization layer 146. A material of the fourth isolation layer 164 may be the same as the material of the above first isolation layer 126, and the fourth isolation layer 164 is used as a protective layer to make the second substrate 120 scratch-resistant, abrasion-resistant, and moisture-resistant.

The first quarter wave plate 142 and the second quarter wave plate 160 of the second substrate 120, the display medium layer 130, the first polarization layer 146, and the second polarization layer 156 may be in a stacked relationship. For example, the second quarter wave plate 160 and the first quarter wave plate 142 are together located between the pixel array 122 and the first polarization layer 146, and the second quarter wave plate 160, the first quarter wave plate 142, and the display medium layer 130 are together located between the second polarization layer 156 and the first polarization layer 146.

The first quarter wave plate 142 may comprise a liquid crystal film, a grating structure, a nanostructure, or a combination thereof. A size of the first quarter wave plate 142 is larger than a size of the second quarter wave plate 160. Here, the size includes "area", "length" and "width". For example, a width W3 of first quarter wave plate 142 is greater than a width W4 of second quarter wave plate 160, as shown in FIG. 2A. Additionally, the optical axis of the first quarter wave plate 142 is positive 45 degrees relative to the optical axis of the second polarization layer 156, and an optical axis of the second quarter wave plate 160 is negative 45 degrees relative to the optical axis of the second polarization layer 156.

The first polarization layer 146 comprises a wire-grid polarizer, and a formation method of the first polarization layer 146 comprises patterning a metal layer into a plurality of parallel metal wires too. In addition to that, a size of the first substrate 110 may also be smaller than a size of the second substrate 120 according to the present embodiment, so that a space underneath the second substrate 120 can be used for accommodating some other elements.

Through the above configuration, the display panel 100B can provide a full specular reflection effect, and the display panel 100B can be switched between an image mode and a specular reflection mode.

When the display panel 100B is in the image mode, pixel electrodes can be driven correspondingly through the pixel array 122 for a pixel area to provide an image so as to couple an electric field. The display medium layer 130 is thus controlled to maintain a polarization state of light beams passing through the display medium layer 130 unchanged. Then, when the backlight module 150 provides light beams towards the first substrate 110, the second polarization layer 156 can allow P-polarized light to pass through. After the P-polarized light passes through the display medium layer 130, a polarization state of the P-polarized light can be maintained. Since the optical axis of the second quarter wave plate 160 and the optical axis of the first quarter wave plate 142 are negative 45 degrees and positive 45 degrees respectively relative to the optical axis of the second polarization layer 156, the P-polarized light that passes through the display medium layer 130 still maintains P polarization state after sequentially passing through the second quarter wave plate 160 and the first quarter wave plate 142. After that, when this P-polarized light reaches the first polarization layer 146, the P-polarized light can pass through the first polarization layer 146 due to the P polarization state. As a result, the corresponding pixel area of the display panel 1006 can provide the image.

When the display panel 100B is in the image mode, for a pixel area to provide a black effect, a polarization state of light beams that pass through can be changed through an optical activity of the display medium layer 130. Therefore, after the second polarization layer 156 allows the P-polarized light to pass through, a polarization state of light beams passing through the display medium layer 130 from the second polarization layer 156 is S polarization, that is, S-polarized light is generated. The S-polarized light still maintains S polarization state after sequentially passing through the second quarter wave plate 160 and the first quarter wave plate 142. Then, when this S-polarized light reaches the first polarization layer 146, the S-polarized light can be reflected from the first polarization layer 146 due to the S polarization state. In other words, light beams propagate from the first substrate 110 towards the second substrate 120 do not leave the display area 102 of the display panel 1006, so that the corresponding pixel area of the display panel 100B can provide the black effect.

Similarly, when the display area 102 of the display panel 100B is so switched that a whole pixel area provides the black effect, the display panel 1006 can be switched to the specular reflection mode. When the display panel 100B is in the specular reflection mode, for light beams above the display panel 100B propagating towards the display panel 100B, S-polarized light in the light beams will be reflected from the first polarization layer 146 so that the display panel 100B can provide the specular reflection effect through the reflected S-polarized light.

Figure 2B:
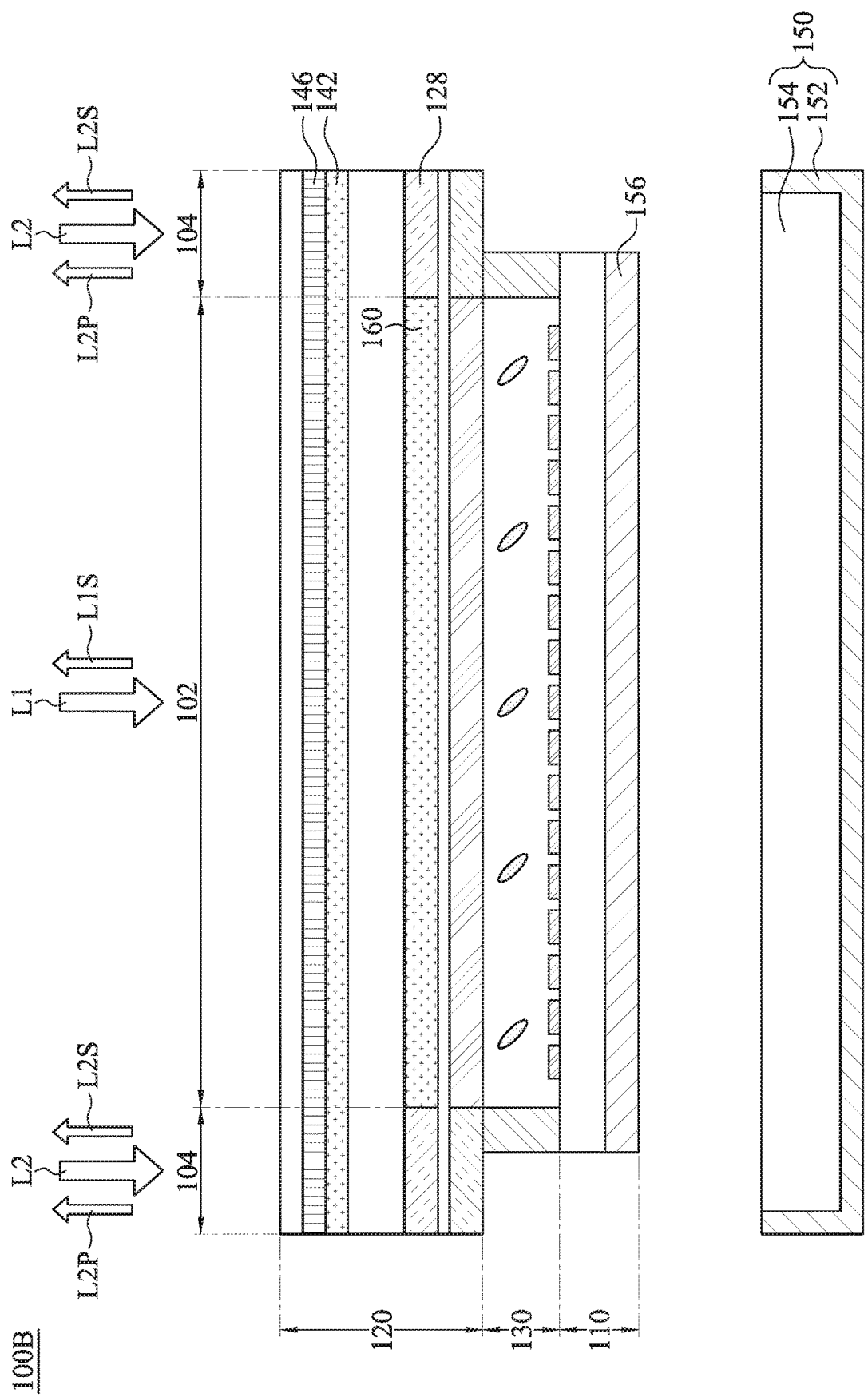
FIG. 2B is a schematic cross-sectional view of the display panel of FIG. 2A when the display panel is in a specular reflection mode.

A description is provided with reference to FIG. 2B. FIG. 2B is a schematic cross-sectional view of the display panel 100B of FIG. 2A when the display panel 100B is in the specular reflection mode. Optical paths of the light beams above the display panel 100B propagating towards the display panel 100B are further described as follows. To simplify matters, a light beam above the display panel 100B propagating towards the display area 102 of the display panel 100B is represented by a light beam L1, and light beams above the display panel 100B propagating towards the peripheral area 104 of the display panel 100B are represented by light beams L2.

When the light beam L1 reaches the first polarization layer 146, S-polarized light in the light beam L1 is reflected from the first polarization layer 146 (this S-polarized light is represented by a light beam L1S). P-polarized light in the light beam L1 can pass through the first polarization layer 146, and the P-polarized light still maintains P polarization state after sequentially passing through the second quarter wave plate 160 and the first quarter wave plate 142. Then, the P-polarized light is converted into S-polarized light after passing through the display medium layer 130, and is absorbed by the second polarization layer 156 afterwards.

When the light beam L2 reaches the first polarization layer 146, S-polarized light in the light beam L2 is reflected from the first polarization layer 146 (this S-polarized light is represented by a light beam L2S). P-polarized light in the light beam L2 can pass through the first polarization layer 146, and propagates towards the first quarter wave plate 142. The P-polarized light will be converted into circularly polarized light after passing through the first quarter wave plate 142, and the circularly polarized light is then reflected from the reflection layer 128. Since in the embodiment shown in FIG. 2B, the material of the reflection layer 128 comprises molybdenum oxide, tantalum, or the combination thereof, the circularly polarized light from the reflection layer 128 is absorbed by the reflective layer 128, thus causing the light intensity to be attenuated (referred to as the first attenuation). The circularly polarized light reflected from the reflection layer 128 can be converted into S-polarized light after passing through the first quarter wave plate 142 and propagates towards the first polarization layer 146. After that, this S-polarized light is reflected from the first polarization layer 146, and is returned to the first polarization layer 146 again through repeating the above path. In the optical path where the S-polarized light is reflected from the first polarization layer 146 and is reflected back to the first polarization layer 146 again through the reflection layer 128, the S-polarized light is absorbed by the reflection layer 128 to cause its light intensity to be attenuated by the reflection layer 128 (referred to as the second attenuation).

Even if the S-polarized light is converted into P-polarized light in the subsequent optical path and passes through the first polarization layer 146 (this P-polarized light is represented by light beams L2P), the light intensity of the light beam L2P is much less than the light intensity of the light beam L1S or L2S after two attenuations by the reflection layer 128. As a result, the light intensity of the light beam L1S approaches a sum of the light intensities of the light beams L2P and L2S to uniform the specular reflection effects provided by the display area 102 and the peripheral area 104.

Figure 3:
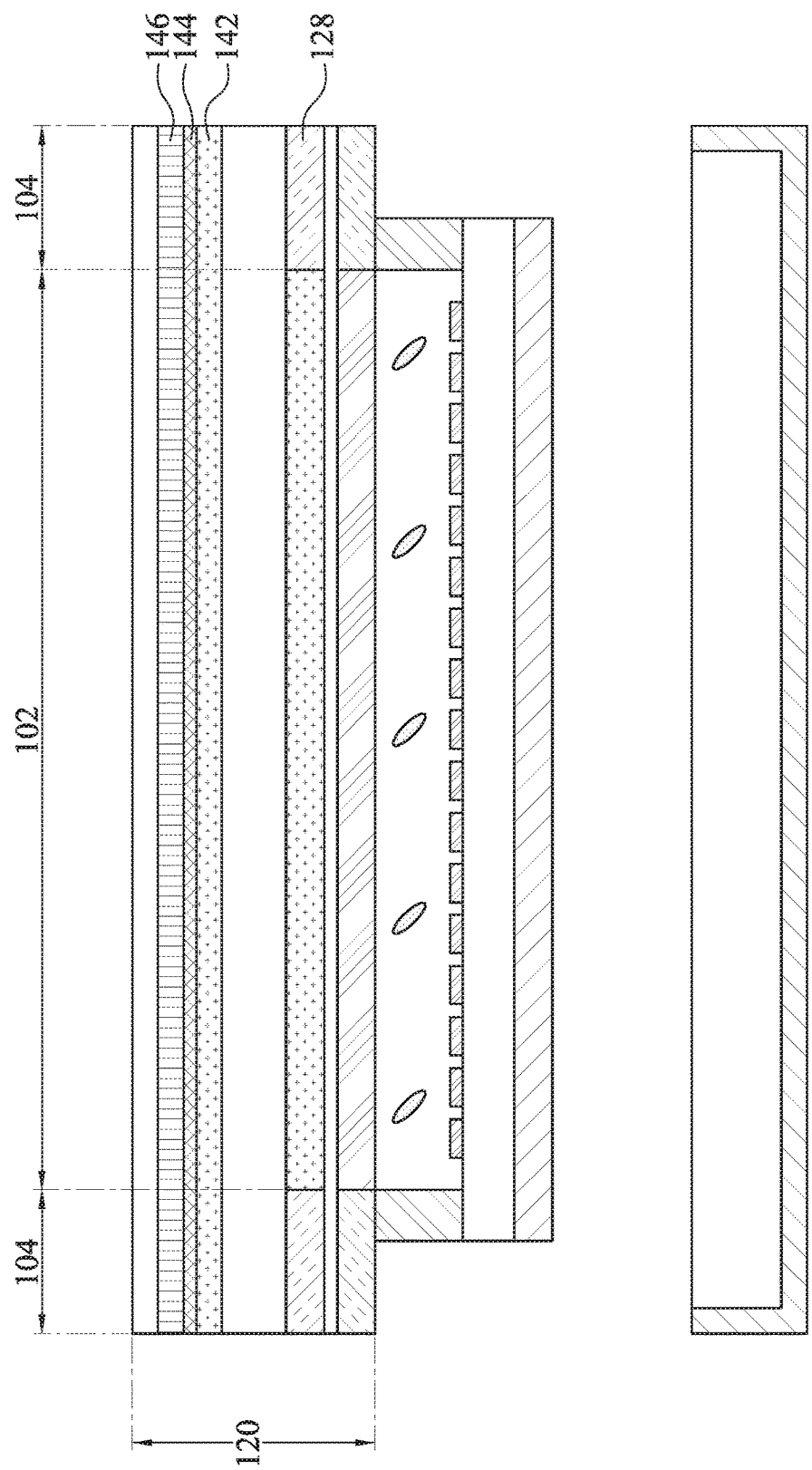
FIG. 3 is a schematic cross-sectional view of a display panel according to a third embodiment of the present disclosure.

A description is provided with reference to FIG. 3. FIG. 3 is a schematic cross-sectional view of a display panel 100C according to a third embodiment of the present disclosure. At least one difference between the present embodiment and the second embodiment is that the second substrate 120 according to the present embodiment further comprises the light absorption layer 144. The light absorption layer 144 is disposed between the first quarter wave plate 142 and the first polarization layer 146, and a material of the light absorption layer 144 may comprise a blackened material.

Through disposing the light absorption layer 144, when P-polarized light above the display panel 100C propagating towards the display panel 100C enters the display panel 100C, not only is the light intensity of the P-polarized light attenuated by the reflection layer 128, but it is also attenuated by the light absorption layer 144. In this regard, the P-polarized light is at least twice attenuated by the reflection layer 128 and once attenuated by the light absorption layer 144. Therefore, even if the P-polarized light leaves from the peripheral area 104 of the display panel 100C in the subsequent optical path, the light intensity of the P-polarized light is attenuated to be much less than the light intensity of light beams used for providing specular reflection to further uniform the specular reflection effects provided by the display area 102 and the peripheral area 104.

In addition, in the embodiment shown in FIG. 3, the light absorption layer 144 is so disposed that it extends to the display area 102. Portions of the light absorption layer 144 located within the display area 102 can prevent unexpected situations from occurring when the display area 102 provides the specular reflection effect. For example, when the display panel 100C is in a specular reflection mode, there may be light beam(s) that are converted into P-polarized light due to multiple reflections within the display area 102 of the display panel 100C, and thus pass through the first polarization layer 146. However, the situation in which the specular reflection effects provided by the display area 102 and the peripheral area 104 are not uniform can be avoided because this P-polarized light is attenuated by the light absorption layer 144 in its optical path.

Although in the embodiment shown in FIG. 3 the light absorption layer 144 is extended to the display area 102, the present disclosure is not limited in this regard. In other embodiments, the light absorption layer 144 may not be extended to the display area 102. In other words, the light absorption layer 144 may surround the display area 102.

Figure 4:
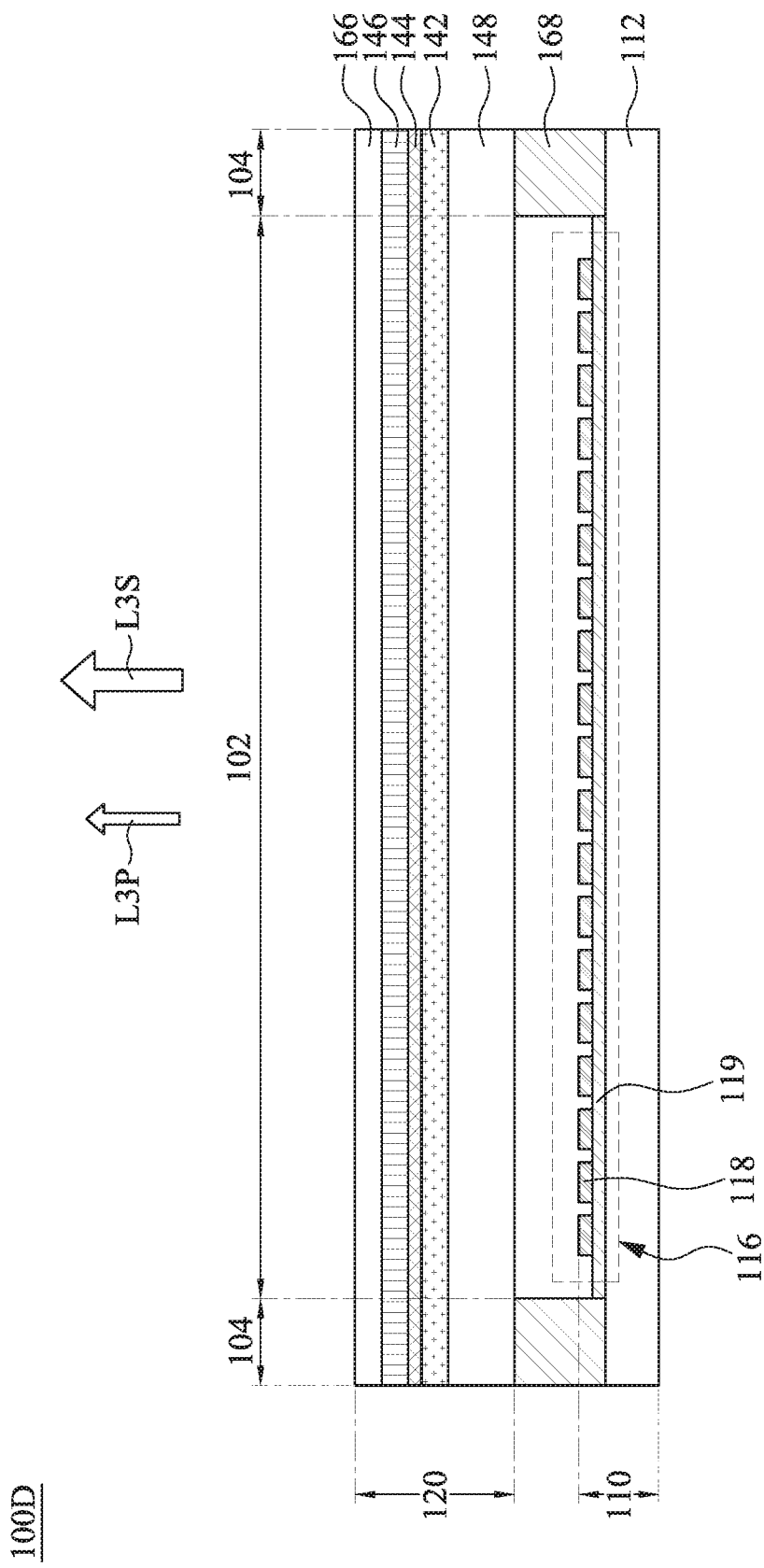
FIG. 4 is a schematic cross-sectional view of a display panel according to a fourth embodiment of the present disclosure.

A description is provided with reference to FIG. 4. FIG. 4 is a schematic cross-sectional view of a display panel 100D according to a fourth embodiment of the present disclosure. At least one difference between the present embodiment and the first embodiment is that the display panel 100D according to the present embodiment displays an image through a light-emitting diode (LED) array.

In greater detail, the display panel 100D has the display area 102 and the peripheral area 104, and the peripheral area 104 is located outside the display area 102. The display panel 100D comprises the first substrate 110, the second substrate 120, and a support 168. The second substrate 120 is located above the first substrate 110, and the support 168 is located between the first substrate 110 and the second substrate 120. The support 168 may be disposed on the first substrate 110 and support the second substrate 120 so that the first substrate 110 can be spaced apart from the second substrate 120 by a distance.

The first substrate 110 comprises the first transparent substrate 112, an LED array 116, and a circuit layer 119. The LED array 116 is disposed on the first transparent substrate 112 and is located within the display area 102. The LED array 116 comprises a plurality of LEDs 118, and different LEDs 118 can provide lights of different colors. In some embodiments, a material of the LED 118 comprises an organic light emitting material, and the different LEDs 118 may comprise different organic light emitting materials to provide light of different colors. The circuit layer 119 may be disposed between the first transparent substrate 112 and the LED array 116, and is located within the display area 102 and the peripheral area 104. The circuit layer 119 may be electrically connected to the LEDs 118 of the LED array 116. In some embodiments, the circuit layer 119 comprises a thin film transistor array, which can be used for driving the LEDs 118 correspondingly.

The second substrate 120 comprises the second transparent substrate 148, the first quarter wave plate 142, the light absorption layer 144, and the first polarization layer 146 located within the display area 102 and the peripheral area 104. The first polarization layer 146 is disposed on the second transparent substrate 148, and comprises a wire-grid polarizer. The first quarter wave plate 142 and the light absorption layer 144 are together located between the first substrate 110 and the first polarization layer 146, and the light absorption layer 144 is located between the first quarter wave plate 142 and the first polarization layer 146. In greater detail, the first quarter wave plate 142, the light absorption layer 144, and the first polarization layer 146 may be sequentially formed on the second transparent substrate 148. Additionally, the first quarter wave plate 142 and the light absorption layer 144 are also together located between the circuit layer 119 and the first polarization layer 146. In addition to that, the second substrate 120 may further comprise a fifth isolation layer 166 disposed on the first polarization layer 146. A material of the fifth isolation layer 166 may be the same as the material of the first isolation layer 126 as mentioned previously, and the fifth isolation layer 166 is used as a protective layer to make the second substrate 120 scratch-resistant, abrasion-resistant, and moisture-resistant.

Through the above configuration, the display panel 100D can provide a full specular reflection effect, and the display panel 100D can be switched between an image mode and a specular reflection mode.

When the display panel 100D is in the image mode, a bias voltage can be applied to the LEDs 118 correspondingly through the circuit layer 119 for a pixel area to provide an image so that the corresponding LEDs 118 emit light beams. After the light beams provided by the LEDs 118 pass through the first quarter wave plate 142, portions of the light beams having a P polarization state can pass through the first polarization layer 146, so that the corresponding pixel area of the display panel 100D can provide the image.

When the display panel 100D is in the image mode, for a pixel area to provide a black effect, the bias voltage can be removed from corresponding LEDs 118 so that the corresponding pixel area of the display panel 100D can provide the black effect. Similarly, when the display area 102 of the display panel 100D is so switched that a whole pixel area provides the black effect, the display panel 100D can be switched to the specular reflection mode.

When the display panel 100D is in the specular reflection mode, for light beams above the display panel 100D propagating towards the display panel 100D, S-polarized light in the light beams will be reflected from the first polarization layer 146 so that the display panel 100D can provide the specular reflection effect through the reflected S-polarized light (represented by a light beam L3S).

In addition, P-polarized light in the light beams will pass through the first polarization layer 146. Here, the P-polarized light is reflected multiple times in the display panel 100D and passes through the first polarization layer 146, and the light intensity of the P-polarized light is at least once attenuated by the light absorption layer 144 in the optical path where the P-polarized light leaves from the display panel 100D. In this regard, when the display panel 100D is in the specular reflection mode, the light intensity of a light beam (represented by a light beam L3P) that passes through the first polarization layer 146 and is to leave from the display panel 100D is much less than the light intensity of the light beam L3S. As a result, the nonuniformity of the total reflected beams caused by the light beam L3P can be alleviated. In other words, the specular reflection effect provided by the display panel 100D can be uniformed through the above configuration.

Additionally, according to the present embodiment, a thickness of the first quarter wave plate 142 may be between 600 nanometers and 1500 nanometers, a thickness of the light absorption layer 144 may be between 50 nanometers and 300 nanometers, and a thickness of the first polarization layer 146 may be between 100 nanometers and 500 nanometers. Under the circumstances that the structure used for uniforming the specular reflection effect is achieved by the first quarter wave plate 142, the light absorption layer 144, and the first polarization layer 146, the above layer thickness ranges can be beneficial for thinning the display panel 100D.

In summary, the second substrate of the display panel according to the present disclosure comprises the first polarization layer, the first quarter wave plate, the reflection layer, and the pixel array. The first polarization layer comprises the wire-grid polarizer, and the first quarter wave plate is located between the first polarization layer and the reflection layer. With the above configuration, the display panel can be switched between the image mode and the specular reflection mode. When the display panel is in the image mode, the corresponding pixel electrodes can be driven through the pixel array so that the display panel provides the image. When the display panel is in the specular reflection mode, the light beams leaving from the interior of the display panel can be attenuated by the layers in the second substrate to uniform the specular reflection effect provided by the display panel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel having a display area and a peripheral area, the peripheral area being located outside the display area, wherein the display panel comprises:
   a first substrate;
   a second substrate located above the first substrate and comprising:
      a first polarization layer located within the display area and the peripheral area and comprising a wire-grid polarizer;
      a first quarter wave plate located within the peripheral area;
      a reflection layer located within the peripheral area, wherein the first quarter wave plate being located between the first polarization layer and the reflection layer;
   a pixel array at least located within the display area; and
   a light absorption layer located between the first polarization layer and the pixel array, and located between the first polarization layer and the first quarter wave plate; and
   a display medium layer located between the first substrate and the second substrate.

2. The display panel of claim 1, wherein the first quarter wave plate is further located within the display area, and the second substrate further comprises a second quarter wave plate located within the display area, and the second quarter wave plate and the first quarter wave plate are together located between the pixel array and the first polarization layer, wherein the display panel further comprises a second polarization layer, and the first quarter wave plate, the second quarter wave plate, and the display medium layer are together located between the second polarization layer and the first polarization layer.

3. The display panel of claim 2, wherein an optical axis of the first quarter wave plate is positive 45 degrees relative to an optical axis of the second polarization layer, and an optical axis of the second quarter wave plate is negative 45 degrees relative to the optical axis of the second polarization layer.

4. The display panel of claim 1, wherein a material of the reflection layer comprises aluminum, gold, silver, titanium, molybdenum oxide, tantalum, or a combination thereof.

5. The display panel of claim 1, wherein the first substrate comprises a plurality of color resist layers, and a vertical projection range of the first substrate on the second substrate falls within a boundary of the first polarization layer.

6. The display panel of claim 1, wherein each of the first quarter wave plate and the reflection layer is in a loop and surrounds the display area.

7. The display panel of claim 1, wherein the second substrate further comprises a drive circuit layer located within the peripheral area and electrically connected to the pixel array, and the reflection layer is located between the drive circuit layer and the first polarization layer.

8. A display panel having a display area and a peripheral area, the peripheral area being located outside the display area, wherein the display panel comprises:
   a first substrate comprising a light emitting diode array located within the display area; and
   a second substrate located above the first substrate and comprising:
      a first polarization layer located within the display area and the peripheral area and comprising a wire-grid polarizer;
      a first quarter wave plate located within the display area and the peripheral area; and
      a light absorption layer located within the display area and the peripheral area, and the light absorption layer and the first quarter wave plate are together located between the first substrate and the first polarization layer, and the light absorption layer is located between the first quarter wave plate and the first polarization layer.

9. The display panel of claim 8, wherein the first substrate further comprises a circuit layer being at least located within the peripheral area and electrically connected to the light emitting diode array, and the light absorption layer and the first quarter wave plate are together located between the circuit layer and the first polarization layer.

* * * * *